(12) United States Patent
Roos

(10) Patent No.: US 9,947,712 B2
(45) Date of Patent: Apr. 17, 2018

(54) MATRIX TYPE INTEGRATED CIRCUIT WITH FAULT ISOLATION CAPABILITY

(71) Applicant: VAREX IMAGING CORPORATION, Salt Lake City, UT (US)

(72) Inventor: Pieter Gerhard Roos, Sandy, UT (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 79 days.

(21) Appl. No.: 15/007,312

(22) Filed: Jan. 27, 2016

(65) Prior Publication Data
US 2017/0213867 A1    Jul. 27, 2017

(51) Int. Cl.
| G01R 31/02 | (2006.01) |
| H01L 27/146 | (2006.01) |
| G01R 31/26 | (2014.01) |
| H04N 5/32 | (2006.01) |
| H04N 5/367 | (2011.01) |
| H04N 5/376 | (2011.01) |

(52) U.S. Cl.
CPC .... *H01L 27/14658* (2013.01); *G01R 31/2601* (2013.01); *H01L 27/14625* (2013.01); *H01L 27/14634* (2013.01); *H01L 27/14636* (2013.01); *H04N 5/32* (2013.01); *H04N 5/367* (2013.01); *H04N 5/376* (2013.01)

(58) Field of Classification Search
CPC .. G06F 11/006; G06F 21/335; G06F 21/6209; G06F 2221/2135; G06F 2221/2149; G06F 21/9501; G06F 21/95607; G06F 21/8422; G06F 2201/0612; G06F 24/10; G01R 31/31718; G01R 31/283; G01R 31/2894; G01R 31/307; G01R 27/02; G01R 31/2889; G01R 31/311; G01R 33/26; G01R 33/323; G01R 33/60; G01R 31/2831; G01R 31/2601; G01R 27/0605; H04N 9/045; H04N 5/367; H04N 5/3675; H04N 5/23254; H04N 5/2176; G06T 7/70
See application file for complete search history.

(56) References Cited

U.S. PATENT DOCUMENTS 4,956,602 A * 9/1990 Parrish .............. G01R 31/2831
                                                     257/E21.526
4,961,053 A * 10/1990 Krug .................. G01R 31/3185
                                                     257/148

(Continued)

*Primary Examiner* — Vinh Nguyen
(74) *Attorney, Agent, or Firm* — Su IP Consulting

(57) ABSTRACT

Technology is described for selectively disconnecting a communal module (e.g., horizontal power and signal distribution network) from conductive traces (e.g., vertical columns) that are coupled to cell elements. In one example, a matrix type integrated circuit includes a two dimensional (2D) array of cell elements, a plurality of conductive traces, a communal module, and a plurality of switches. Each cell element in the 2D array provides a similar function. The plurality of conductive traces is substantially parallel to a first axis of the 2D array. Each conductive trace is coupled to a conductive interconnect of cell elements adjacent to the conductive trace. The communal module is configured to provide distribution of at least one electrical signal to the cell elements in the 2D array via at least two conductive traces that are substantially parallel to the first axis.

25 Claims, 15 Drawing Sheets

(56) References Cited

U.S. PATENT DOCUMENTS

| | | | | |
|---|---|---|---|---|
| 5,446,395 | A | * | 8/1995 | Goto .................. G01R 31/2884 324/754.03 |
| 5,648,661 | A | * | 7/1997 | Rostoker .......... G01R 31/31850 257/208 |
| 2006/0028569 | A1 | * | 2/2006 | Sekine .............. H01L 27/14627 348/308 |
| 2008/0121808 | A1 | * | 5/2008 | Roizin .................. G01T 1/2018 250/370.11 |

* cited by examiner

US 9,947,712 B2

MATRIX TYPE INTEGRATED CIRCUIT WITH FAULT ISOLATION CAPABILITY

BACKGROUND

Unless otherwise indicated herein, the approaches described in this section are not prior art to the claims in this disclosure and are not admitted to be prior art by inclusion in this section.

Typically, an image sensor includes an array of pixel elements fabricated as an integrated circuit (IC) on a semiconductor substrate, such as silicon wafer. Very-large-scale integration (VLSI) is the process of creating an IC by combining thousands of transistors and other circuit elements into a single chip or die. The wafer serves as the substrate for microelectronic devices (e.g., image sensors) built in and over the wafer and undergoes many microfabrication process steps such as doping or ion implantation, etching, deposition of various materials, and photolithographic patterning. After the wafer is processed, the individual microcircuits or dies are separated (e.g., using wafer dicing) and packaged. The semiconductor wafer can include a number of dies. For example, a 300 millimeter (mm) (130) wafer (100) (i.e., 11.811 inches ["] or approximately [~] 12") can include 148-20 mm (132) square dies (110), as shown in FIG. 1. Dies typically refer to ICs prior to being packaged and encased in a supporting case (e.g., plastic) that prevents physical damage and corrosion. Chips typically refer to ICs after being packaged (or assembled) that include electrical leads that allow the ICs to be coupled to other electronic components.

A conventional image sensor has a relatively small die size (e.g., less than [<] 5×5 centimeters [cm]) and includes a two dimensional (2D) array of sensor elements (or pixels) that perform a similar function. Very large area complementary metal-oxide-semiconductor (CMOS) image sensors (e.g., greater than or equal to [≥] 5×5 cm) can provide improved imaging performance over conventional image sensor for some scenarios, such as medical imaging (e.g., x-ray imaging), as well as in other high end imaging applications in astronomy, cinematography, and other scientific imaging. The very large area CMOS image sensors are at least an order of magnitude (10×) larger than devices for which conventional CMOS imager manufacturing processes have been developed. CMOS imager manufacturing processes often rely on know-how developed for silicon wafer based semiconductor chip manufacturing, where rectangular dies used in chips are conventionally in the 1 to 25 mm size range. Thus, very large area CMOS image sensors are well outside the chip size range conventionally used by the semiconductor manufacturing technology field. The technology (circuitry, devices, and methods) described herein provides improvements in very large area CMOS image sensor circuit designs as well as conventional image sensors.

BRIEF SUMMARY OF SOME EXAMPLE EMBODIMENTS

In standard manufacturing processes, it is common to have a number of fatal defects per wafer due to material and process variations along with contaminants. Such defects can include semiconductor crystal defects causing faulty devices or short circuits between metal conductors. The some defects may render the chip candidates defective or non-conforming, which are typically considered acceptable, because each wafer contains a large number of chip candidates and the loss of a few of these candidates, due to defects, is minimal and factored into the yield and cost of fabricating conforming chips. The yield refers to the number of conforming chips divided by the total number of candidate chips.

This number of fatal defects (i.e., causing non-conforming chips) however not acceptable for very large sensors (e.g., ≥5×5 cm), where a wafer may contain only one or very few individual candidate chips. For example, a single short circuit (e.g. between two power supply conductors) on a wafer with only one candidate chip may render the whole wafer as scrap. As a result, a near zero yield of conforming chips may be a likely outcome using conventional semiconductor manufacturing processes and designs.

Components can be added to circuitry or steps taken to reduce the number of wafer defects causing fatal device failures. In one embodiment, a matrix type integrated circuit includes a two dimensional (2D) array of cell elements, a plurality of conductive traces, a communal module, and a plurality of switches. Each cell element in the 2D array provides a similar function (e.g., pixel detector element, pixel image element, pixel display element, or memory element). The plurality of conductive traces is substantially parallel to a first axis (e.g., y-axis) of the 2D array (e.g., arranged in columns). Each conductive trace is coupled to a conductive interconnect (e.g., horizontal trace) of cell elements adjacent to the conductive trace. The communal module is configured to provide distribution of at least one electrical signal to the cell elements in the 2D array via at least two conductive traces that are substantially parallel to the first axis (e.g., in a column).

In an example, the matrix integrated circuit is a complementary metal-oxide-semiconductor (CMOS) image sensor and each cell element includes a photodiode for a pixel. The CMOS image sensor can be an X-ray image sensor that includes a scintillator layer that coverts radiation into light photons for the photodiodes. In another example, the matrix integrated circuit is an x-ray image sensor and each cell element includes a photoconductor material which can convert x-ray radiation or x-ray photons directly to electrical charges in a direct detection scheme.

In another example, the first axis is a y-axis and the plurality of conductive traces couple cell elements in columns. Or alternately, the first axis can be an x-axis and the plurality of conductive traces couple cell elements in rows.

Each of the switches can include tri-state logic or an enable buffer. In another example, each of the switches can include fusible links.

In a configuration, a length of each of the at least two of the plurality of conductive traces extends beyond a reticle boundary. In another configuration, a length of each of the at least two of the plurality of conductive traces is greater than 50 mm (e.g., extending over into at least two reticle areas).

The plurality of conductive traces can provide different types of electrical signals, such as power signals, digital signals, and analog signals. In an example, the plurality of conductive traces include at least one power trace, at least one digital signal trace, and at least one analog signal trace coupled to each cell element. The communal module is configured to provide distribution of a power signal to the cell elements in the 2D array via the at least one power trace, and a control signal to the cell elements in the 2D array via the at least one digital signal trace, and a reference signal to the cell elements in the 2D array via the at least one analog signal trace. The plurality of switches includes at least one power switch, at least one control switch, and at least one reference switch. The plurality of switches is controlled by an enable signal. The at least one power switch is coupled to the at least one power trace, the at least one control switch is coupled to the at least one digital signal trace, and the at least one reference switch is coupled to the at least one analog signal trace.

In a configuration, the matrix type integrated circuit includes disable logic to selectively disable the plurality of switches. The disable logic includes a programming port (e.g., programming input or pin) that allows external access to the matrix type integrated circuit for programming the disable logic. The disable logic can include a serial control register, a shift register, an address register, a programmable read-only memory (PROM), a non-volatile random-access memory (NVRAM), or combinations of these circuit elements.

In another configuration, the matrix type integrated circuit includes a plurality of fault detectors. Each fault detector is coupled to at least one of the plurality of conductive traces (e.g., in a column) and is configured to detect a fault condition on the coupled conductive traces and generate a fault status signal when the fault condition occurs. In an example, each fault detector includes a current sense amplifier. The fault condition can include an excessive supply current on at least one of the conductive traces, a short circuit between at least two of the conductive traces, or combinations of these conditions.

In another example, the matrix type integrated circuit includes a fault status module coupled to the plurality of the fault detectors. The fault status module is configured to capture the fault status signal for each fault detected by the fault detectors. The fault status module includes a status port (e.g., selection input/pin or status data output/pin) that allows external access to the matrix type integrated circuit for reading the captured fault status of the fault detectors. The fault status module can include a serial register, a shift register, a multiplexer, a NVRAM (e.g., flash memory), or combinations of these circuit elements. In a configuration, the fault status module includes a fault detector selector input to read the fault status signal of a specified fault detector from the status port.

In another example, the matrix type integrated circuit includes disable logic and an automatic fault isolator. The disable logic is configured to selectively disable the plurality of switches. The disable logic also includes an internal programming input. The automatic fault isolator configured to program the disable logic via the internal programming input based on the fault status signal for each fault detector obtained by the fault status module. The automatic fault isolator includes a field-programmable gate array (FPGA), a state machine, a microprocessor, or combinations of these circuit elements. In a configuration, the automatic fault isolator includes a fault detector selector output, a fault status input, and a disable logic program output. The fault detector selector output is coupled to a fault detector selector input of the fault status module that is configured for selecting a specified fault detector. The fault status input is coupled to the status port of the fault status module that is configured for reading the fault status signal of the specified fault detector. The disable logic program output is coupled to the internal programming input of the disable logic to selectively disable the plurality of switches based on the fault conditions detected by the plurality of fault detectors. In another configuration, the automatic fault isolator includes a programming port (e.g., programming input or pin) that allows external access to the matrix type integrated circuit for programming the automatic fault isolator.

Another example provides a method of selectively disabling a plurality of switches coupled to a communal module for a matrix type integrated circuit. The method includes the operation of fabricating or providing a 2D array of cell elements that includes a plurality of conductive traces, a communal module, and a plurality of switches. The plurality of conductive traces is substantially parallel to a first axis (e.g., y-axis) of the 2D array. Each conductive trace is coupled to a conductive interconnect of cell elements adjacent to the conductive trace. Each cell element provides a similar function (e.g., pixel image element, pixel display element, or memory element). The communal module is configured to provide distribution of electrical signals to the cell elements in the 2D array via at least two conductive traces that are substantially parallel to the first axis. Each switch in the plurality of switches is configured to selectively disconnect the communal module from one of the conductive traces. The next operation of the method can include selectively disabling the plurality of switches coupled to the communal module from at least one of the conductive traces.

In another example, the method can further include detecting a fault condition on at least one of the conductive traces using a plurality of fault detectors. Each fault detector is coupled to at least one of the plurality of conductive traces. The next operation of the method includes generating a fault status signal when the fault condition occurs. The method can further include, using a fault status module, registering a fault status bit for each fault detector generating the fault status signal. The fault condition can include an excessive supply current on at least one of the conductive traces, a short circuit between at least two of the conductive traces, or combinations of these conditions.

In another example, the method can further include, based on the fault status signals from the plurality of fault detectors, automatically programming selected switches to disable the communal module from the conductive traces.

In another embodiment, a matrix type integrated circuit includes a 2D array of cell elements, a plurality of vertical traces, a communal module, and a plurality of switches. The 2D array of cell elements is arranged in vertical columns and horizontal rows. Each cell element provides a similar function. The plurality of vertical traces is arranged in each column of the 2D array. Each vertical trace is coupled to a conductive interconnect of cell elements within each column. The communal module configured to provide distribution of electrical signals to the cell elements in the 2D array via at least two vertical traces for each column. Each switch in the plurality of switches is configured to selectively disconnect the communal module from one of the vertical traces.

The summary provided above is illustrative and is not intended to be in any way limiting. In addition to the examples described above, further aspects, features, and advantages of the invention will be made apparent by reference to the drawings, the following detailed description, and the appended claims.

DETAILED DESCRIPTION OF SOME EXAMPLE EMBODIMENTS

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Numbers provided in flow charts and processes are provided for clarity in illustrating steps and operations and do not necessarily indicate a particular order or sequence. Unless otherwise defined, the term "or" can refer to a choice of alternatives (e.g., a disjunction operator, or an exclusive or) or a combination of the alternatives (e.g., a conjunction operator, and/or, a logical or, or a Boolean OR).

Disclosed embodiments relate generally to very large area complementary metal-oxide-semiconductor (CMOS) matrix type integrated circuits and, more particularly, to distributing power, control, and reference signals and methods for detecting faults in the matrix type integrated circuit and disabling these distributed signals.

CMOS is a technology for constructing integrated circuits (ICs) that uses complementary and symmetrical pairs of p-type and n-type metal oxide semiconductor field effect transistors (MOSFETs) for logic functions. CMOS devices do not consume as much energy (e.g., produce as much waste heat) as other forms of logic, for example transistor-transistor logic (TTL) or N-type metal-oxide-semiconductor (NMOS) logic, which normally have some standing current even when the device is not changing state.

Figure 1:
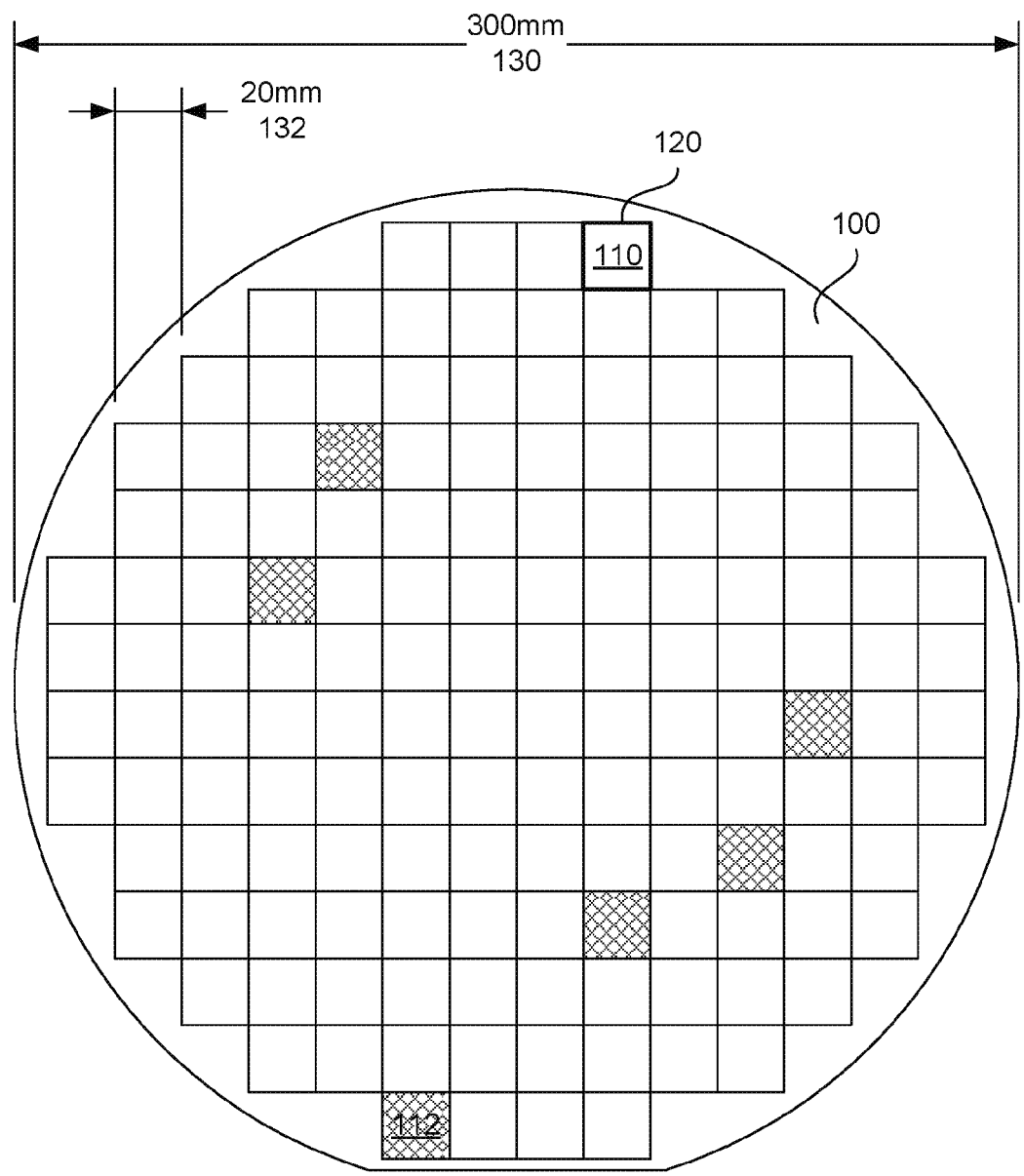
FIG. 1 illustrates a block diagram of an example 300 mm semiconductor wafer including a number of 20 mm square dies.

FIG. 1 illustrates an example semiconductor wafer 100 with a 300 mm diameter 130. Wafers can have various diameters, such as 300 mm, 200 mm, 150 mm, 125 mm, and 100 mm. The maximum number of dies a wafer can generate depends on the wafer diameter and the dimensions of the dies. For example, a 300 mm wafer 100 can generate 148-20 mm square dies 110. Conventionally, each die is designed to operate as a separate functional circuit that may be individually package or coupled to other electrical components and circuits. As discussed previously, due to inherent material and process variations along with contaminants all the fabricated dies or chip candidates do not typically result in functional or conforming circuits. A few chip candidates can have defects that are severe enough that the circuit of those chips will not perform within the chip's requirements (e.g., maximum allowed current) and may even affect other areas of the chip or coupled circuits. A fatal defect is a defect that results in a chip that does not perform within the chip's requirements, referred to as a non-conforming chip or die 112. FIG. 1 illustrates a wafer with 6 non-conforming dies 112.

Conventionally, the process of fabricating integrated circuits on dies involves using photolithography to transfer a geometric pattern from a photomask or reticle to a light-sensitive chemical photoresist (or simply resist) on a substrate (e.g., wafer). The photomask or reticle is an opaque plate with holes or transparencies that allow light to shine through in a defined pattern. A series of different reticles along with doping, ion implantation, etching, and deposition may be used to fabricate the integrated circuits. The feature size of the integrated circuits is typically determined by the reticle, light wavelength of the light source for the reticle, photoresist, time of exposure, and etching processes. Some reticles can be used to fabricate features that are less than 50 nm. Conventionally, reticles are smaller than wafers. For example, a wafer 100 can have a 300 mm diameter and a reticle area 120 that is 20×20 mm, as shown in FIG. 1. Current technology for producing relatively small features (<200 nm width) has reticle dimensions up to 50 mm (e.g., 40×40 mm). A stepper is used to duplicate the image of the reticle over the entire wafer. The stepper is a device used in the manufacture of ICs that is similar in operation to a slide projector or a photographic enlarger. The die can be smaller, a similar size, or larger than the reticle area. FIG. 1 illustrates a reticle area 120 with a similar size to a die 110. Although dies and reticles are shown as squares for simplicity of illustration, the dies and reticles can also be rectangular or any geometric shape. Reticles are typically rectangular to maximize the area of the wafer.

Figure 2:
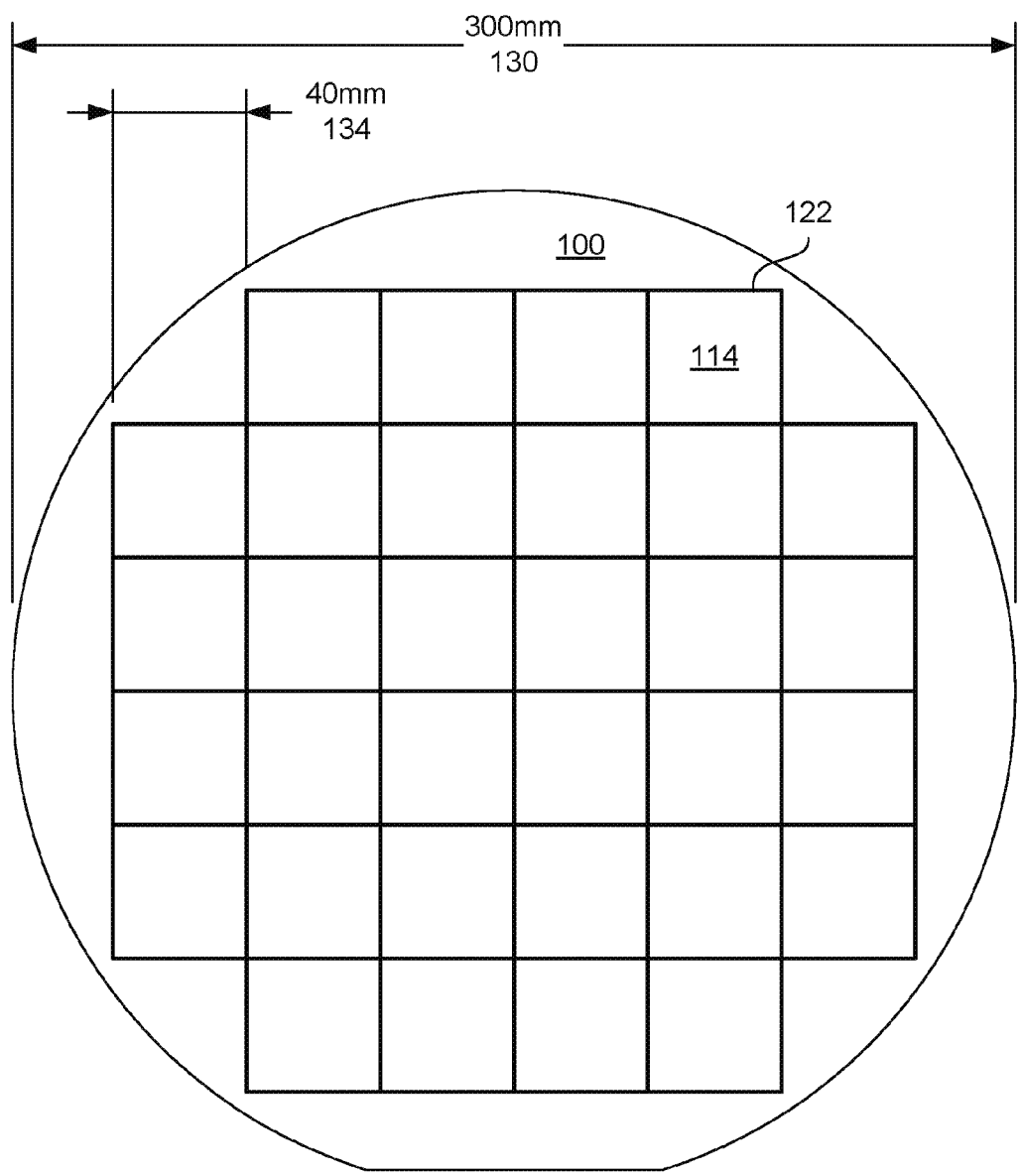
FIG. 2 illustrates a block diagram of an example 300 mm semiconductor wafer including a number of 40 mm square dies.
Figure 3:
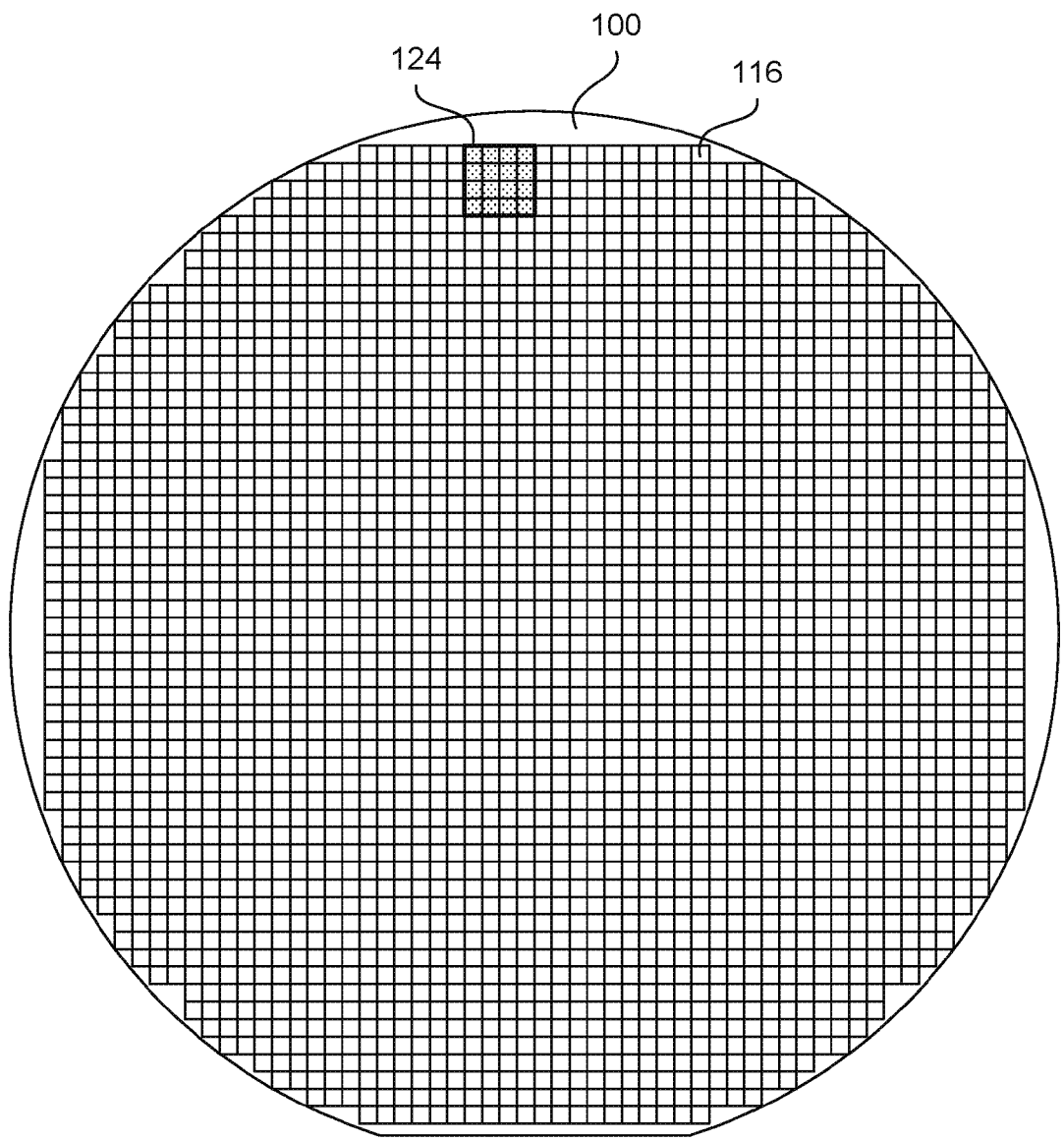
FIG. 3 illustrates a block diagram of an example 300 mm semiconductor wafer including a 5 mm square dies using a 20 mm square reticle.

FIG. 2 illustrates an example semiconductor wafer 100 with a 300 mm diameter 130 and 32-40 mm 134 square dies 114. The reticle area 122 has a similar size to a die 114. FIG. 3 illustrates an example semiconductor wafer 100 with a 300 mm diameter and multiple 5 mm square dies 116. The reticle area 124 is larger than the dies 116. In FIG. 3, the 20×20 mm reticles are used to fabricate 16-5×5 mm dies 116 per reticle area.

Figure 4:
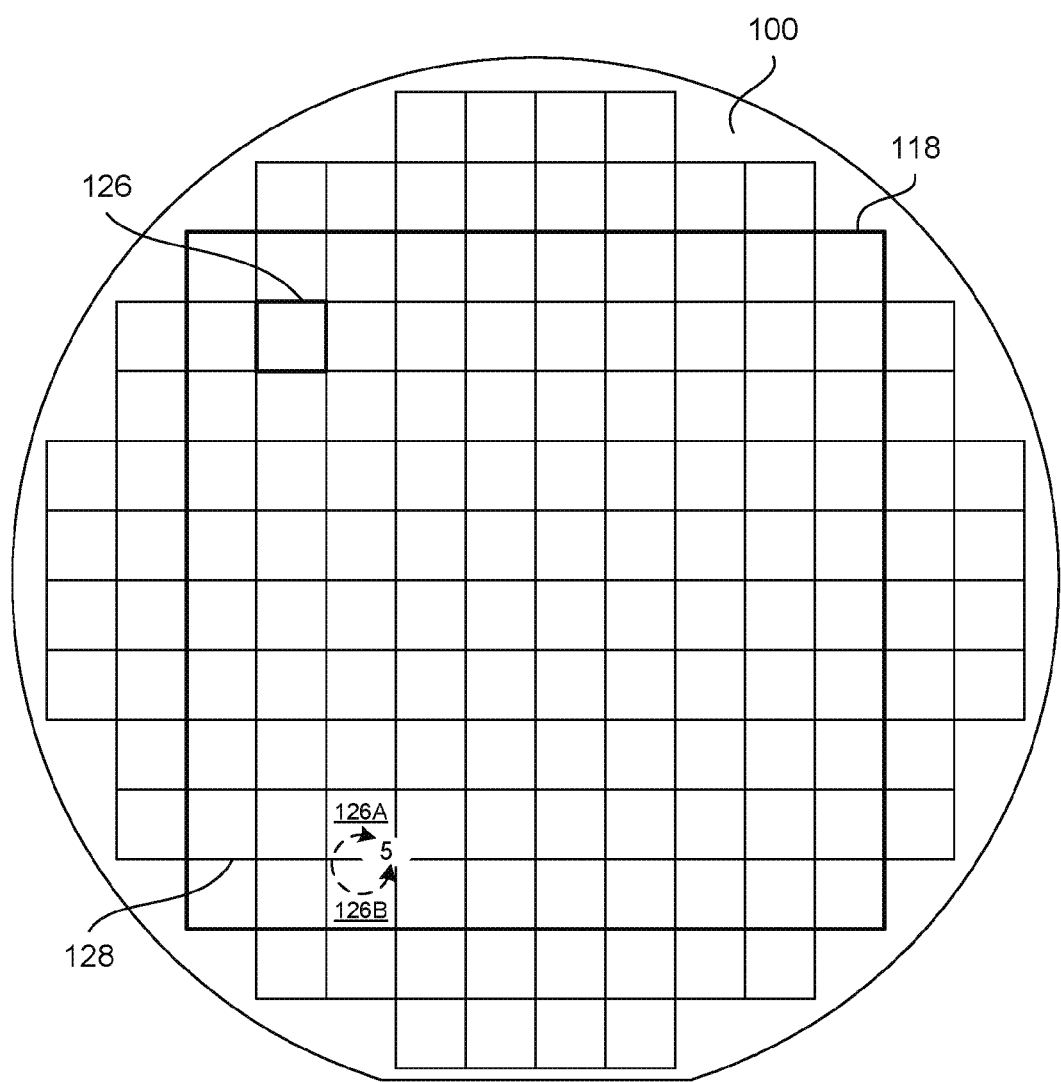
FIG. 4 illustrates a block diagram of an example 300 mm semiconductor wafer including a 200 mm square die using a 20 mm square reticle.

FIG. 4 illustrates an example semiconductor wafer 100 with a 300 mm diameter and a single 200 mm square die 118. The reticle area 126 is smaller than the die 118. When the die is a similar size or smaller than the reticle area, the reticle boundary 128 between reticle areas is typically cut during wafer dicing using a saw or a laser or otherwise unused in circuit functionality and operation. When the reticle area 126 is smaller than the die 118, electrical conductors (e.g., aluminum, gold, copper, or poly silicon) or traces can extend across the reticle boundary 128 and can be used to connect circuit features from one reticle area to another reticle area. As used herein, a trace is an electrical conductor used to connect circuit elements (e.g., transistors, diodes, capacitors, resistors, and inductors) of an integrated circuit together. In addition to defects caused by material and process variations occurring within the reticle area, defects can also occur on the reticle boundaries 128, such as over exposure or under exposure of photoresist on the edges resulting in over etching or under etching (or over doping or under doping) causing opens and shorts. A short or short circuit is accidental or unintended connection between two nodes of an electrical circuit, which can cause excessive current to flow through the unintended connection. An open or open circuit is infinite resistance between two nodes, which can electrically disconnect circuit elements that would otherwise be connected.

The various defects that can occur in very large area integrated circuits (e.g., dies larger than the reticle area) or wafer-scale integration (WSI) can create near zero yield or unacceptable yield of conforming chips. Wafer-scale integration is a very-large integrated circuit that uses an entire semiconductor wafer (e.g., silicon wafer) to produce a single super-chip. Throughout this disclosure, reference is made to very large area CMOS image sensors; the technology (e.g., circuitry, devices, and methods) and solutions disclosed may also apply to conventional image sensors, x-ray image sensors, displays, memory arrays, and any other matrix type integrated circuit.

Conforming very large area integrated circuits, such as very large area CMOS image sensors used in medical imaging (e.g., x-ray imaging), astronomy, cinematography, scientific imaging, and other high end imaging applications, can have improved imaging performance over smaller image sensors (i.e., smaller than 50×50 mm image sensors). Conventional image sensors and very large area ICs are matrix type integrated circuits that include a two dimensional (2D) array of image or pixel cell elements. Each of these image cell elements performs a similar function of detecting photons (e.g., light or x-ray photons) and converting the photons in a specified location to an electrical charge or current. The pattern of detected photons and areas with no detected photons on the array is used to generate an image. The electrical components of the image cell elements can have similar electrical connections to vertical (y-axis) and horizontal (x-axis) electrical traces that extend in columns and rows, respectively. The vertical traces (e.g., column traces) in columns and horizontal traces (e.g., row traces) in rows can be used to distribute power, control signals, and reference signals to the image cell elements as well as receive outputs from the image cell elements. Vertical, columns, horizontal, and rows are relative references to the large plane of the semiconductor substrate. Throughout this disclosure reference is made to vertical traces or columns; the vertical trace features may also apply to horizontal traces and the columns features may also apply to rows, if the orientation of the substrate is rotated 90 degrees. Vertical traces and columns are used for ease of explanation of the features.

The vertical and horizontal traces can extend to the signal distribution and signal processing circuitry or networks shared by the cell elements at the edge or periphery of the array. As used herein, signal distribution circuitry or signal processing circuitry shared by a plurality of cell elements at the edge or periphery of the array is referred to as communal circuitry or a communal module. The communal module can provide power, control signals, and reference signals inputs to the cell elements. In addition, the communal circuitry or the communal module may also provide signal processing of outputs from the cell elements. Power refers to an electrical voltage potential and associated current used to activate transistors and other electric components in the cell elements, such as $V_{DD}$ or $V_{CC}$ (positive voltage potential), ground or GND (near zero voltage potential, approximately [~] 0 volts [V], or voltage potential reference), and $V_{SS}$ (negative voltage potential). For many digital circuits, such as image sensors, the nominal supply voltage or positive voltage ($V_{DD}$ or $V_{CC}$) can be 1.8V, 2.4V, 3.3V, or 5.0V. As used herein, a control signal refers to digital signals used to control the function of the cell element. A digital signal is a signal that represents, a sequence of discrete values, such as a logic signal with two possible values—a logic "1" or high voltage potential (e.g., $V_{DD}/2$ to $V_{DD}$ or [$V_{CC}$-Thresh$_{High}$ value] to $V_{CC}$) and a logic "0" or low voltage potential (e.g., ~0V to $V_{DD}/2$ or ~0V to [0V+Threshold$_{Low}$ value]). As used herein, a reference signal refers to an analog signal. An analog signal is a continuous signal for which a time varying feature (variable) of the signal is a representation of some other time varying quantity. Although, in some scenarios control signal can include analog signals or reference signals can include digital signals, for the consistency of terminology and ease of explanation in this disclosure, a control signal is a digital signal and a reference signal is an analog signal.

The communal module can be located on any of the four edges of the 2D array, such as all four edges, three edges, two edges, or only one edge. The conductive traces in one of the axes (e.g., y-axis) can extend to the edge or periphery of the array. In the case of very large area integrated circuits (e.g., very large area CMOS image sensors) the conductive traces extend over multiple reticle areas and crosses at least one reticle boundary. For example, functioning conductive traces along one axis can be greater than 50 mm.

Figure 5:
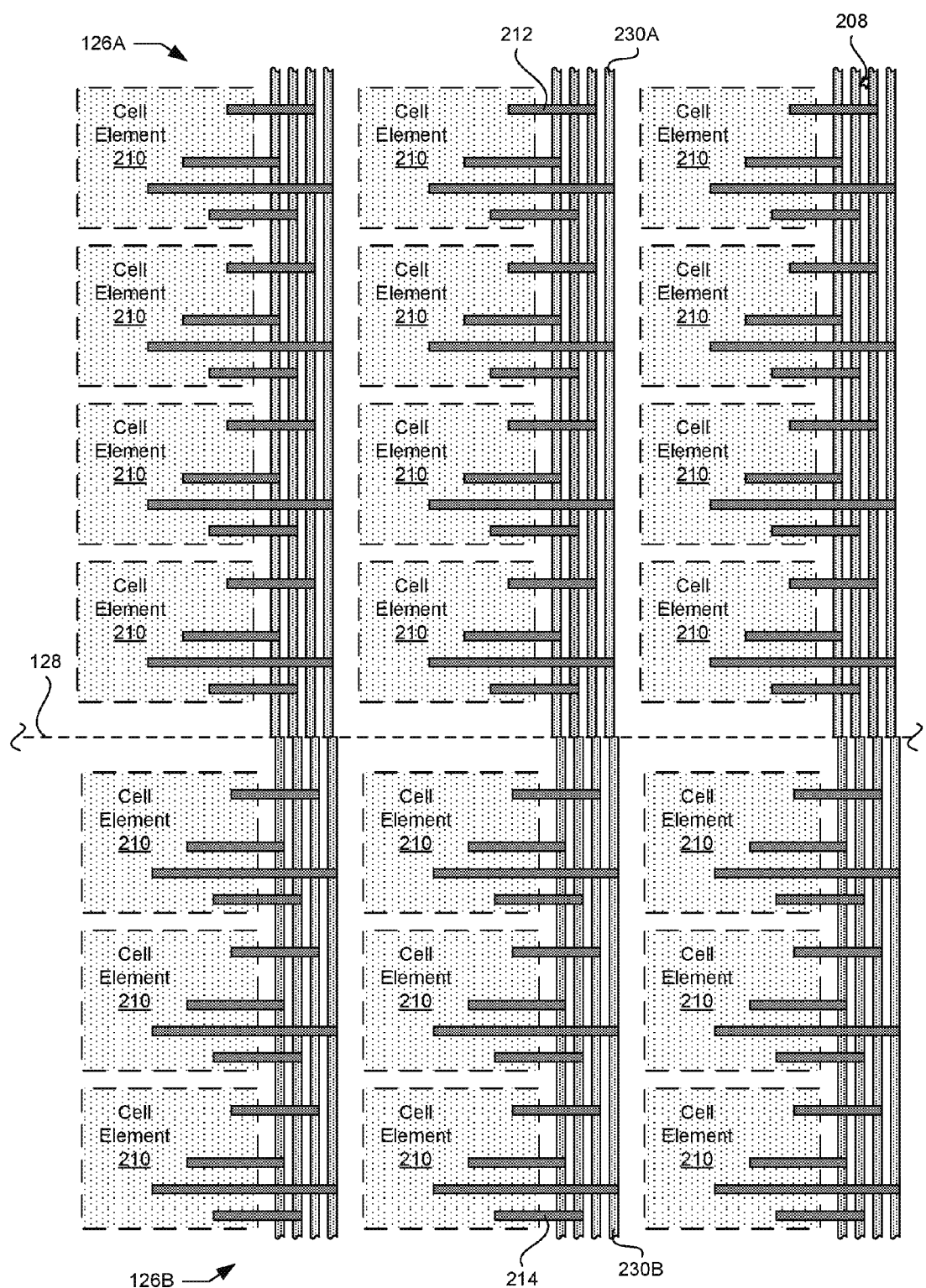
FIG. 5 illustrates an expanded view of an example reticle boundary.

FIG. 5 illustrates an expanded view of matrix type integrate circuit at a reticle boundary 128 of a 2D array of cell elements 210. Each cell element 210 has at least one conductive interconnect 212 that electrically couples each cell element 210 to the vertical conductive traces 230A and 230B. Typically, the alignment of features within a reticle area can be more precise than the alignment of features between reticle areas (i.e., between two reticles 126A and 126B). Reticles within a reticle area can be optically aligned with each other, while adjacent reticles are aligned with each other via a mechanical stepper. FIG. 5 illustrates a slight misalignment that can occur between the vertical conductive traces 230A of a first reticle area 126A and the vertical conductive traces 230B of a second reticle area 126B, which may also increase the likelihood of defects on the reticle boundary. A defect 208 (e.g., material or process variation or contaminant) is illustrated between two vertical conductive traces 230A that can cause a short between the conductive traces 230A.

As discussed previously, detects can have a variety of causes, such as semiconductor crystal defects causing faulty cell elements or short circuits between conductive traces. Any one of these defects can be fatal and cause the die to be non-conforming, which can result in lowering the yields, which can be especially problematic for wafers with a single die or very few dies, such as very large area integrated circuits.

Figure 6:
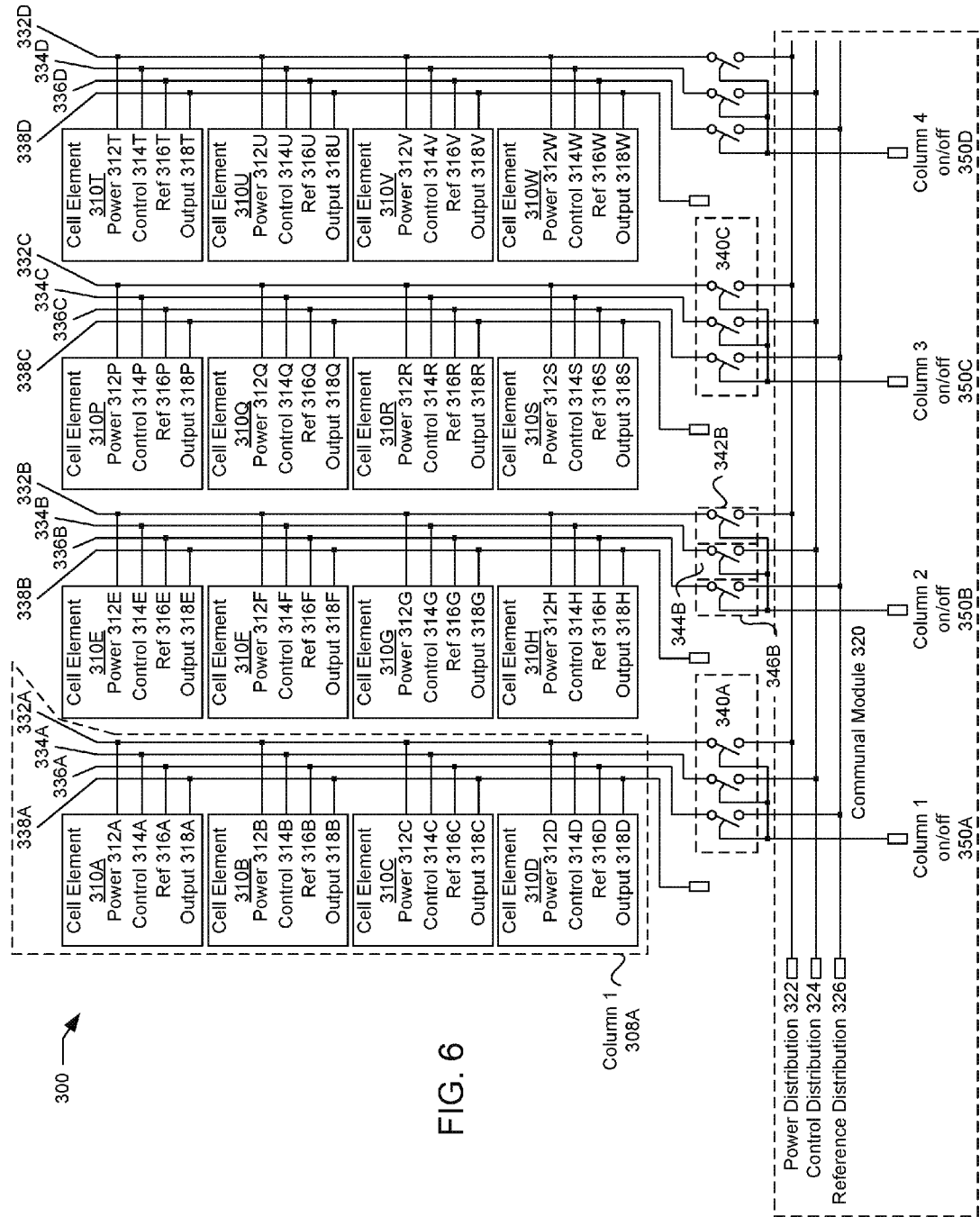
FIG. 6 illustrates a schematic diagram of an example 4×4 array of cell elements including switches coupling a communal module to cell elements via column conductors.

FIG. 6 illustrates a schematic diagram of an array 300 of cell elements 310A-H and 310P-W that includes example circuitry for isolating fatal defects occurring in a column 308A from operation, which can bring the die back into conformity. The isolation circuitry 340A-340C, can disable (or remove) a few columns that have a fatal defect along the column (e.g., a short circuit between traces along a column or cell element in a column) from operation in the array. FIG. 6 illustrates a 4×4 array of cell elements as a section of a 2D array of cell elements. Each cell element 310A-H and 310P-W includes a power input 312A-H and 312P-W, a control signal input 314A-H and 314P-W, a reference signal input 316A-H and 316P-W, and an output 318A-H and 318P-W. Although the power input, control signal input, reference signal input, and output are each shown as a single line, each power input, control signal input, and reference signal input may represent a group of inputs and have multiple inputs, and each output line may represent a group of outputs and have multiple outputs. Each input and output can have a conductive interconnect (e.g., horizontal trace) to a conductive trace (e.g., vertical trace) 332A-D, 334A-D, 336A-D, and 338A-D.

A communal module 320 is located on an edge (e.g., bottom edge) of the array or outside the array. The communal module 320 includes circuitry to provide power distribution 322, control signal distribution 324, and reference signal distribution 326. The array shown in FIG. 6 confines power, control signals, reference signals, and outputs along a first axis (e.g., y-axis or along the matrix column 308A) or substantially parallel to the first axis. Distribution of the power, control signals, and reference signals along a second axis (e.g., x-axis) or substantially parallel to the second axis (i.e., substantially perpendicular to the first axis) occurs in the communal module at an edge of the array. The communal module may process data from large groups of cell elements, supply control and reference signals to from large groups of cell elements, or perform functions applicable to the whole chip (e.g., power supply conditioning or column on/off control 350A-N). U.S. Patent Application Publication No. 2015/0326208 entitled, "Differential Reference Signal Distribution Method and System," which is incorporated by reference in its entirety, discloses example circuitry of a communal module for generating at least one reference signal. Other circuitry of the communal module for distributing power, control, and reference signal may also be used.

The isolation circuitry 340A-340C each includes a switch 342B, 344B, and 346B between each of the input conductive traces 332A-D, 334A-D, and 336A-D and the communal module 320. The power switch 342B selectively couples a power trace 332B to the power distribution circuitry 322. The control switch 344B selectively couples a control signal trace 334B to the control signal distribution circuitry 324. The reference switch 346B selectively couples a reference signal trace 336B to the reference signal distribution circuitry 326. In an example, each switch can include tri-state logic or an enable buffer. In another example, each switch can include a fusible link. The fusible link does not operate as a "true" switch that can open and close repeatedly. The fusible link uses a fuse in place of a switch which can permanently open (e.g., blown through increased current in a smaller cross sectional area conductive trace) the link between the conductive traces 332A-D, 334A-D, and 336A-D and the communal module 320. The switchable switch (e.g., tri-state logic or an enable buffer type switch) allows greater flexibility to control the columns of the array.

Each switch 342B, 344B, and 346B can be in a normally closed position. Normally closed refers to a switch that is closed when no control signal is applied to the switch. As illustrated in FIG. 6, the switches can isolate the columns (e.g., vertical distribution networks) from the communal module (e.g., horizontal distribution networks) so a localized wafer defect does not contaminate the rest of the chip causing chip failure. Each switch can be controlled or enabled by a column on/off input or signal 350A-D that opens the switches in a column 308A (e.g., with a defect) and disables the signals (e.g., power, control signals, and reference signals) from the column. Each column 308A has its own column on/off input or signal 350A-D. Although multiple on/off inputs (not shown) can be used to enable (i.e., open) individual switches 342B, 344B, and 346B in a single column, enabling any one of a power trace 332B, a control signal trace 334B, or a reference signal trace 336B typically renders an output 338B of a cell element 310E-H invalid. Thus, using a single on/off input 350A-D to enable (i.e., open) all the switches in a column can disable the column from the array and reduce the number of inputs used to control the conductive traces in the column.

In another example, the isolation circuitry includes a switch (not shown) between the output conductive traces 338A-D and an output module at an edge of the array. In one example, the output may not be coupled to the communal module because the communal module provides power and signal distribution, which is not coupled to cell elements outputs. Adding a switch to an output conductive trace 338A-D may add additional circuitry without providing improved performance and a reduction in fatal defects.

In another example the switch can be normally open position. Normally open refers to a switch that is open when no control signal is applied to the switch. Each switch can be controlled or enabled by a column on/off input or signal 350A-D that closes the switches in a column 308A that allows a column to function normally and keeps open the switches to disable the columns with defects. Normally open switches can use more energy than the normally closed switches since the great majority of columns function normally with the switches closed.

Referring back to FIG. 6, once defects and their associated columns are identified, an enable signal on the column on/off input 350A-D can be applied to the isolation switches 342B, 344B, and 346B of the isolation circuitry 340A-340C. In some examples, disabling a column may not adversely affect the operation or function of a die or chip. For example, in a sensor array, the sensor may include millions of tightly packed detector elements (or pixel elements). The loss of detection by a column may be adequately sensed or detected by adjacent columns without significantly impacting resolution.

The dies may be tested for defects on the wafers using tiny probes that press again various contact pads on the dies. Additionally or alternatively, the chips may be tested for defects on the leads or pins after packaging (or assembly). The tests on the array depend upon the type of cell elements used in the array.

Figure 7:
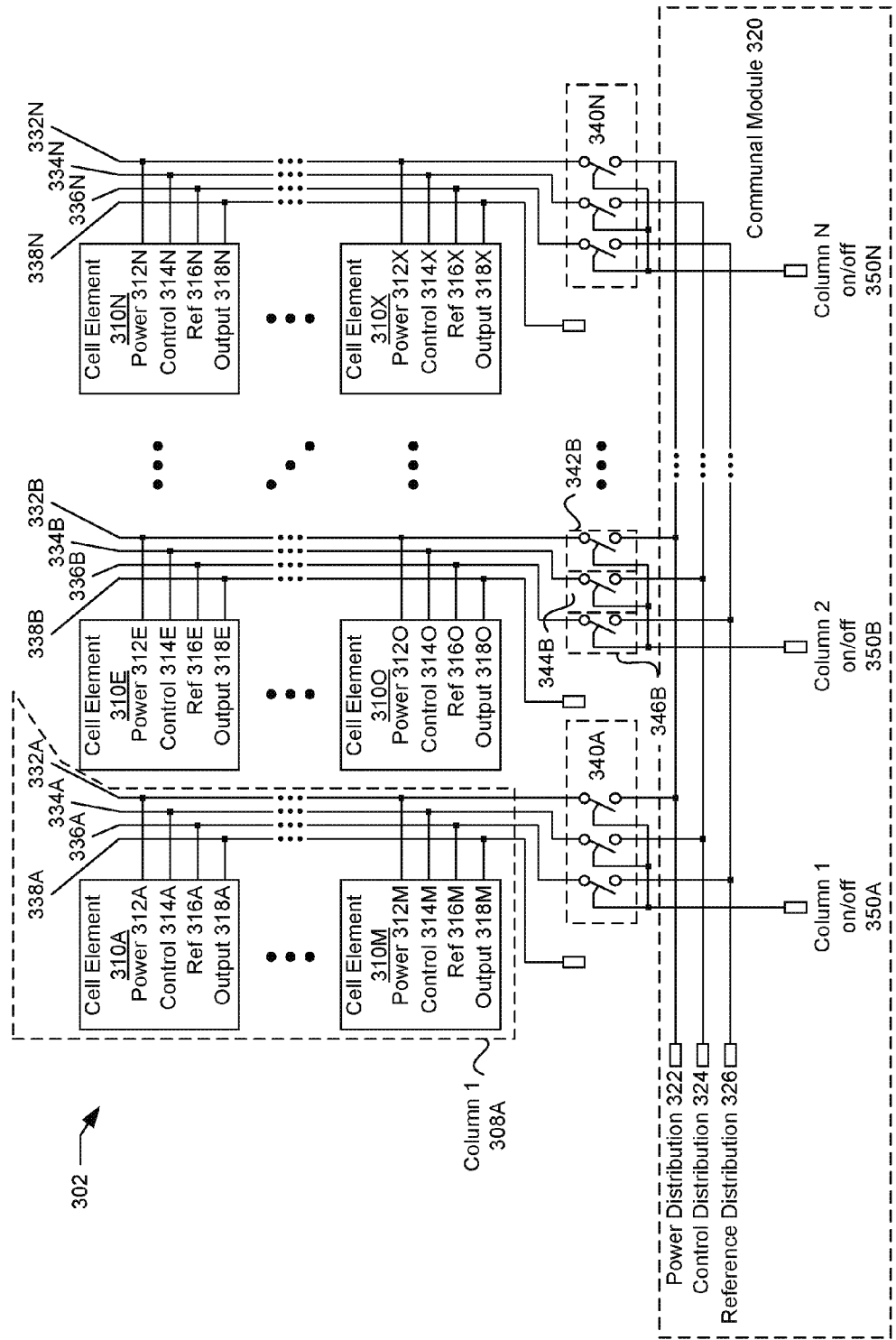
FIG. 7 illustrates a schematic diagram of an example two dimensional (2D) array of cell elements including switches coupling a communal module to cell elements via column conductors.

FIG. 7 illustrates an m×n array 302 of cell elements 310A, E, M, N, O, X that includes switches 342B, 344B, and 346B of the isolation circuitry 340A-N coupling the conductive traces (e.g., vertical traces) 332A-N, 334A-N, 336A-N, and 338A-N to the communal module 320. Each switch can be controlled or enabled by a column on/off input or signal 350A-N that opens the switches in a column (e.g., with a defect).

Figure 8:
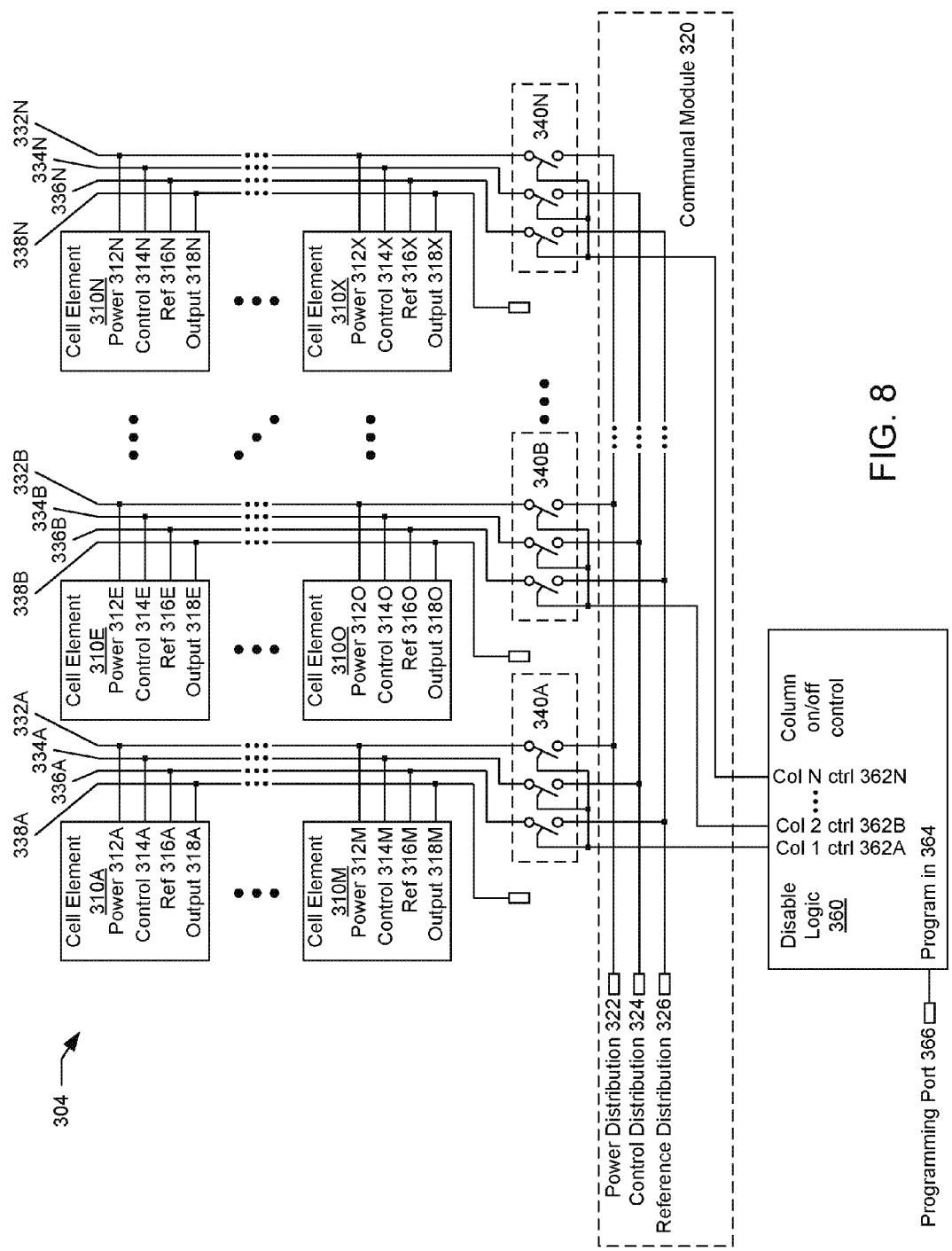
FIG. 8 illustrates a schematic diagram of an example 2D array of cell elements including disable logic for controlling switches coupling a communal module to cell elements via column conductors.

FIG. 8 illustrates an array 304 of cell elements 310A, E, M, N, O, X that includes disable logic 360 for controlling switches 342B, 344B, and 346B of the isolation circuitry 340A-N. The disable logic includes at least one program input 364 and at least one output 362A-N (e.g., column control) corresponding to each column isolation switch group 340A-N to selectively disable columns. The program input 364 can be coupled to a programming port 366 that allows external access to the disable logic from outside the chip. The disable logic can include a serial control register, a shift register, an address register, a programmable read-only memory (PROM), or a non-volatile random-access memory (NVRAM). A shift register is a cascade of latches or flip flops, sharing the same clock, in which the output of each flip-flop is connected to a data input of the next flip-flop in the chain, resulting in a circuit that shifts by one position a bit array stored in the register, shifting in the data present at its input and shifting out the last bit in the array, at each transition of the clock input. A serial control (SCON) register is special function serial-in, parallel-out (SIPO) register used as a control circuit that converts a serial input to a parallel output from latches or flip-flops in register. The output from latches or flip-flops in register can provide the column control 362A-N. An address register is a cascade of latches or flip flops that holds the instructions or an address for a control circuit. A PROM or field programmable read-only memory (FPROM) or one-time programmable non-volatile memory (OTP NVM) is a form of digital memory where the setting of each bit is locked by a fuse, antifuse, or floating-gate transistor. The PROM may also include erasable programmable ROM (EPROM) or electrically EPROM (EEPROM). The EPROM and EEPROM are types of non-volatile memory that retain their data when the EPROM power supply is switched off and also allows individual bytes to be erased and reprogrammed. The EPROM uses floating-gate transistors. The EPROM can be erased by exposure to a strong light source (e.g., ultraviolet light source) or electrically (i.e., EEPROM). NVRAM is random-access memory that retains its information when power is turned off (non-volatile). NVRAM includes flash memory and solid-state storage. The disable logic 360 provides a centralized circuit or function to control the switches 342B, 344B, and 346B of the isolation circuitry 340A-N. The disable logic may be factory programmed during testing (e.g., PROM) or in the field if an error is subsequently detected or generated. In some rare cases, fatal errors may occur after the chip is sent to a customer.

Figure 9:
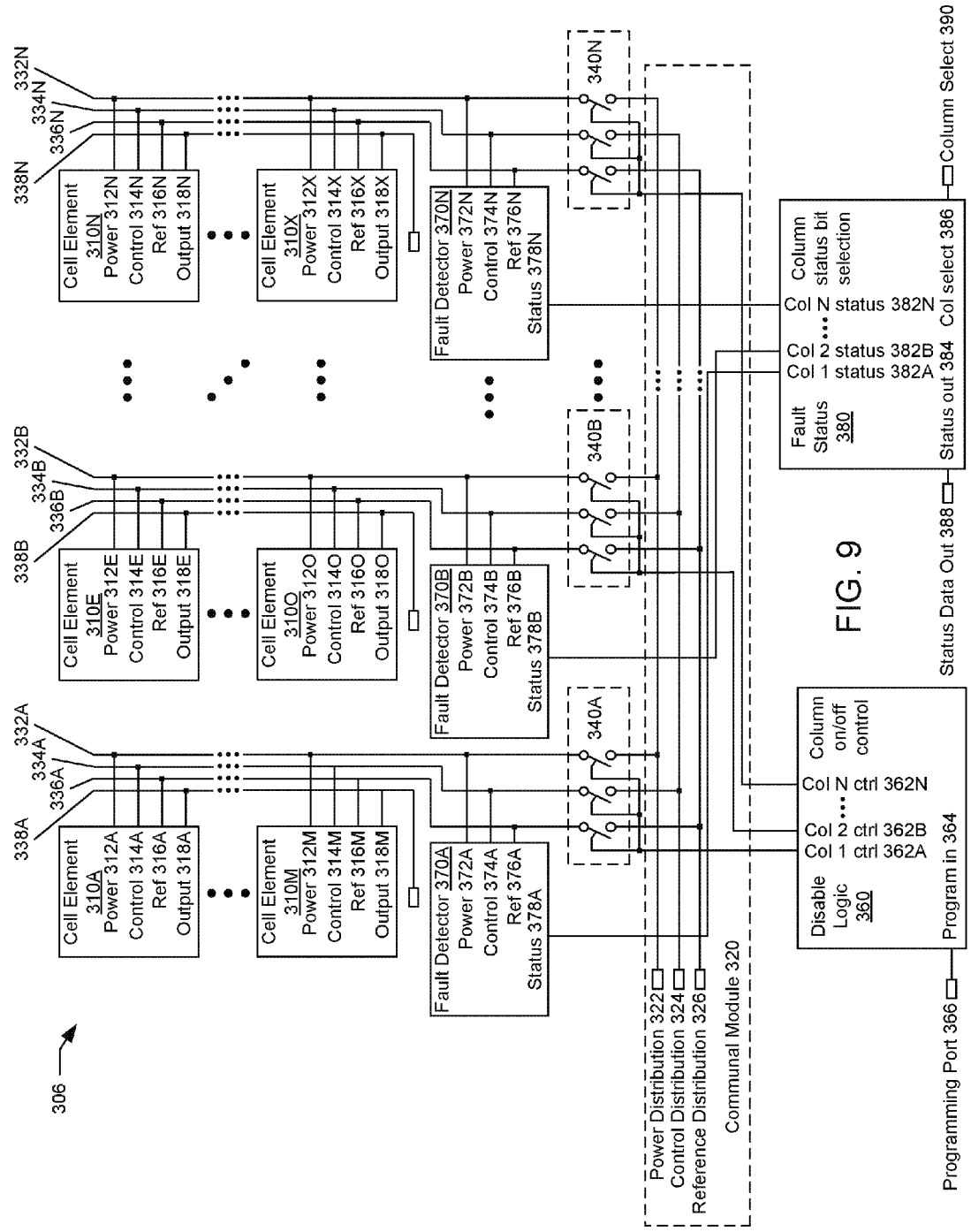
FIG. 9 illustrates a schematic diagram of an example 2D array of cell elements including fault detectors and disable logic for controlling switches coupling a communal module to cell elements via column conductors.

FIG. 9 illustrates an array 306 of cell elements 310A, E, M, N, O, X that includes fault detectors 370A-N, a fault status module 380, and disable logic 360. A fault detector is associated with the input conductive traces 332A-N, 334A-N, and 336A-N in a column. Each fault detector 370A-N includes a power input 372A-N, a control signal input 374A-N, a reference signal input 376A-N, and status output 378A-N. The power input 372A-N is coupled to the power trace 332A-N, the control signal input 374A-N is coupled to the control signal trace 334B, and the reference signal input 376A-N is coupled to the reference signal trace 336B. The fault detector inputs are used to detect a fault condition on the conductive traces that can generate a fatal defect, such as an excessive supply current on at least one of the conductive traces or a short circuit between at least two of the conductive traces. In an example, the each fault detector includes a current sense amplifier. If a fault condition is detected, the fault detector 370A-N generates a fault status bit on the status output 378A-N. For example, a logic 1 can represent a fault condition and a logic 0 can represent a non-fault condition (i.e., good column).

The fault status module 380 collects the fault status bit from each of the status outputs 378A-N of the fault detectors 370A-N via column status inputs 382A-N, which represents faulty columns in the array. The fault status module 380 can provide a mechanism to read the fault detectors 370A-N at an output external to the chip. The fault status module 380 includes at least one control input 386, at least one status output 384, and column status inputs 382A-N coupled to each the status outputs 378A-N of the fault detectors 370A-N. In one configuration, the control input includes a column select 386 coupled to a column select port 390 that allows external access to the fault status module from outside the chip to select a column fault status bit to read. Then, the status output 384 can generate the fault status bit for the selected column on a status data output port 388 that is accessible from outside the chip. In another configuration, fault status module stores the fault status bit of each column in a latch or flip-flop of a register. The control input can receive a signal to output all or a portion of bits of the registers serially on the status data output port 388. So, all or portion of the fault status bits of the array can be obtained with a single input signal. The fault status module can include a serial register, a shift register, a multiplexer, or a NVRAM. A serial register is a register that has a serial input or serial output. In one example, the shift register is a parallel-in, serial-out (PISO) register that stores bits in latches or flip-flops in parallel and converts the parallel inputs into a serial output. The multiplexer is a circuit that selects one of several analog or digital input signals and forwards the selected input into a single line or output. When the fault status module includes a multiplexer, the fault status module may pass the fault status bit from the fault detectors without storing the value in a latch, flip-flop, or register. Based on the output from the fault status module 380, a user, tester, or automated disabling system can determine which columns to disable or isolate.

Figure 10:
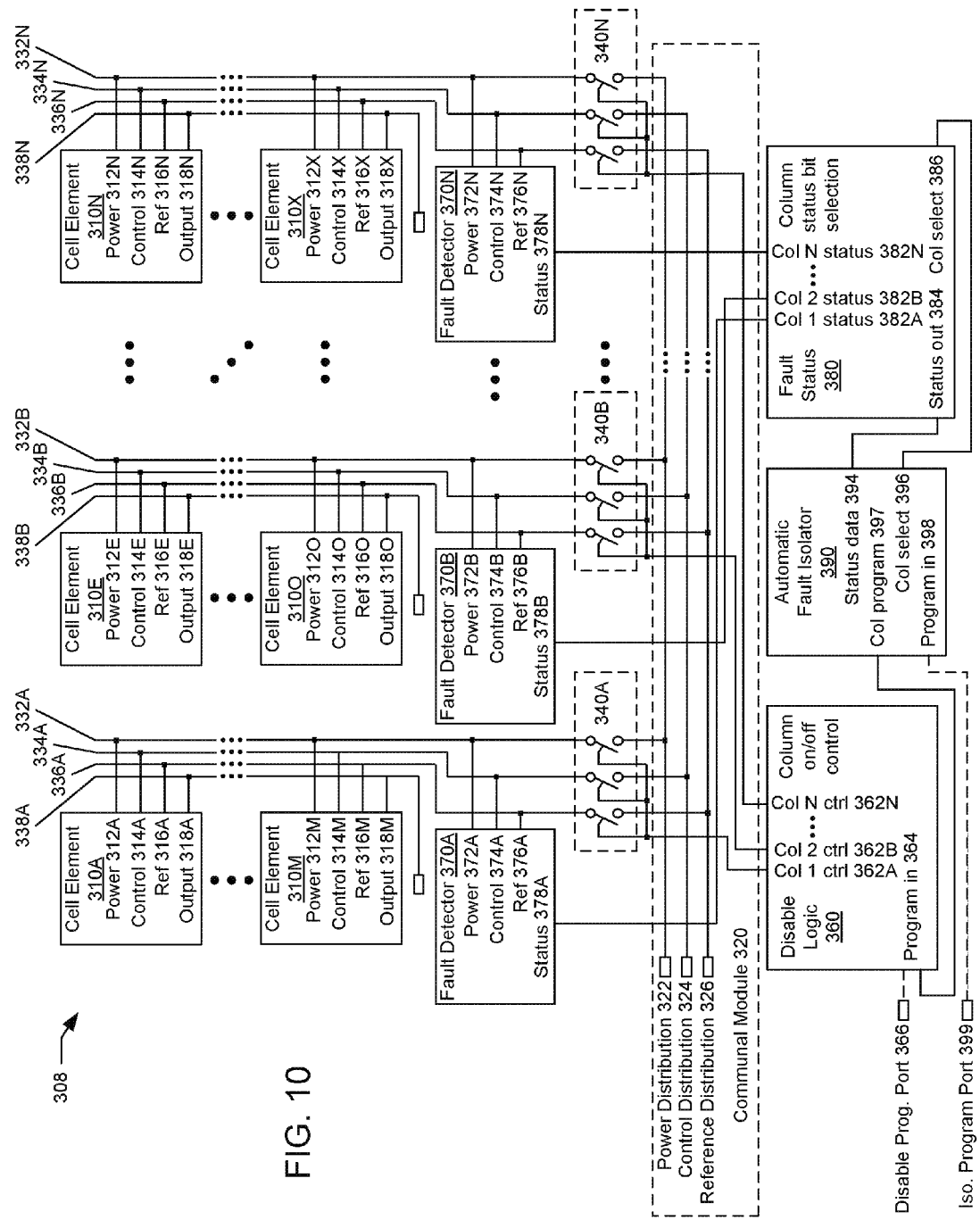
FIG. 10 illustrates a schematic diagram of an example 2D array of cell elements including fault detectors, an automatic fault isolator, and disable logic for controlling switches coupling a communal module to cell elements via column conductors.

FIG. 10 illustrates an array 308 of cell elements 310A, E, M, N, O, X that includes fault detectors 370A-N, a fault status module 380, an automatic fault isolator 390, and disable logic 360. The automatic fault isolator 390 receives fault status data for columns with defects from the fault status module 380 and automatically programs the disable logic 360 to disable the columns with the defects via the isolation switches 340A-N. In a configuration, the automatic fault isolator 390 includes at least one column select output 396, a status data input 394, a column program output, and at least one program input 398. The column select output 396 is coupled to the column select input 386 of the fault status module 380 and is used to request a fault status bit from a specified fault detector 370A-N. The status output 384 of the fault status module 380 is coupled to the status data input 394 of the automatic fault isolator 390 and is used to provide the requested fault status value. Based on the received fault status value, the automatic fault isolator 390 then generates a programming signal on the column program output 397 for the disable logic 360 which enables and controls the isolation switches 340A-N. The column program output 397 is coupled to the program input 364 of the disable logic 360. The program input 364 of the disable logic 360 may have at least two inputs. One program input may allow programming via a disable programming port 366 that is accessible from outside the chip. Another program input may be coupled to internal circuitry such as the automatic fault isolator 390. The automatic fault isolator 390 may also include a program input 398 that is coupled to an isolator programming port 399 that is accessible from outside the chip for programming, revising, and updating the program or algorithm of the automatic fault isolator 390. The automatic fault isolator 390 can include a field-programmable gate array (FPGA), a state machine, or a microprocessor. The FPGA is an IC designed to be configured by a customer or a designer after manufacturing. The state machine a mathematical model of computation used to design sequential logic circuits, which uses one of a finite number of states in operation. The microprocessor is a computer processor that incorporates the functions of a central processing unit (CPU) with instruction code on a single IC. The automatic fault isolator provides a self-healing chip that uses the fault status module 380 and the disable logic 360 to eliminate or reduce some of the chips own faulty circuits.

FIGS. 6-10 provide various embodiments of detecting defects or faults within an array or matrix of cell elements and disabling or isolating those columns, conductive traces, or cell elements associated with those defects or faults from common distribution networks or communal modules of the chip. Isolating defects occurring in an array of elements can allow some non-conforming chips to be conforming and improve the yields of conforming dies on wafers, especially very large area integrated circuits that are prone to have more defects.

Figure 11:
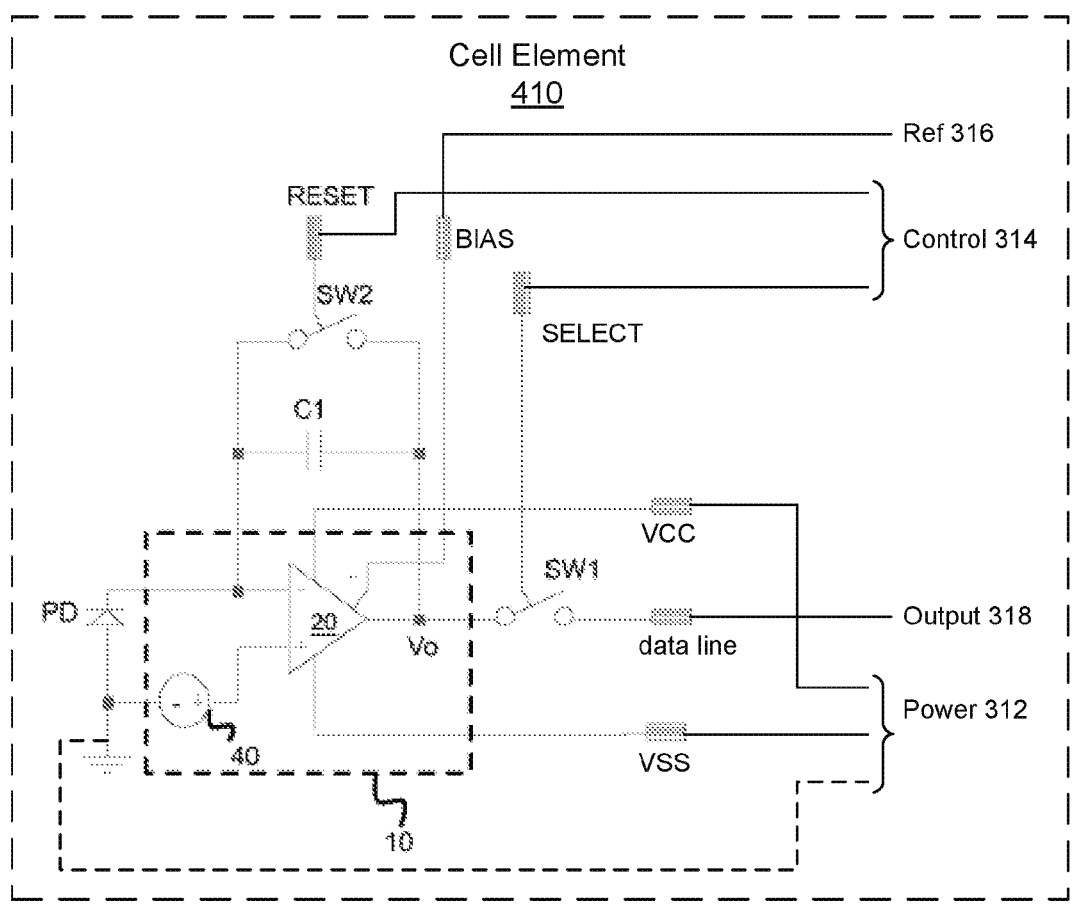
FIG. 11 illustrates a schematic diagram of an example imaging cell element for an array.

Each cell element in the array provides a similar function (e.g., pixel detector element, pixel display element, or memory element). International Publication No. WO2015038709 and U.S. patent application Ser. No. 14/418,955 entitled, "Pixel Circuit with Constant Voltage Biased Photodiode and Related Imaging Method," which is incorporated by reference in its entirety, discloses an example pixel circuit or detector element for an imaging array or matrix that may be used as a cell element 310A-H and 310M-X. FIG. 11 illustrates a cell element 410 that includes a pixel circuit or detector element for an imaging array or matrix. Each of the pixel circuits 410 includes a photo diode PD, a biasing circuit 10, a charge-to-voltage converter C1, and switches SW1 and SW2. The photo diode converts photons into an electric charge or current. The biasing circuit 10 includes an operational amplifier (op amp) 20 and a voltage source 40. The pixel circuit may be configured to operate based on control signals 314 RESET and SELECT and a reference signal 316 BIAS. VCC, VSS, and GND provide voltages or power 312 to the op amp 20 and other components of the pixel circuit and data line provides an output 318.

Figure 12:
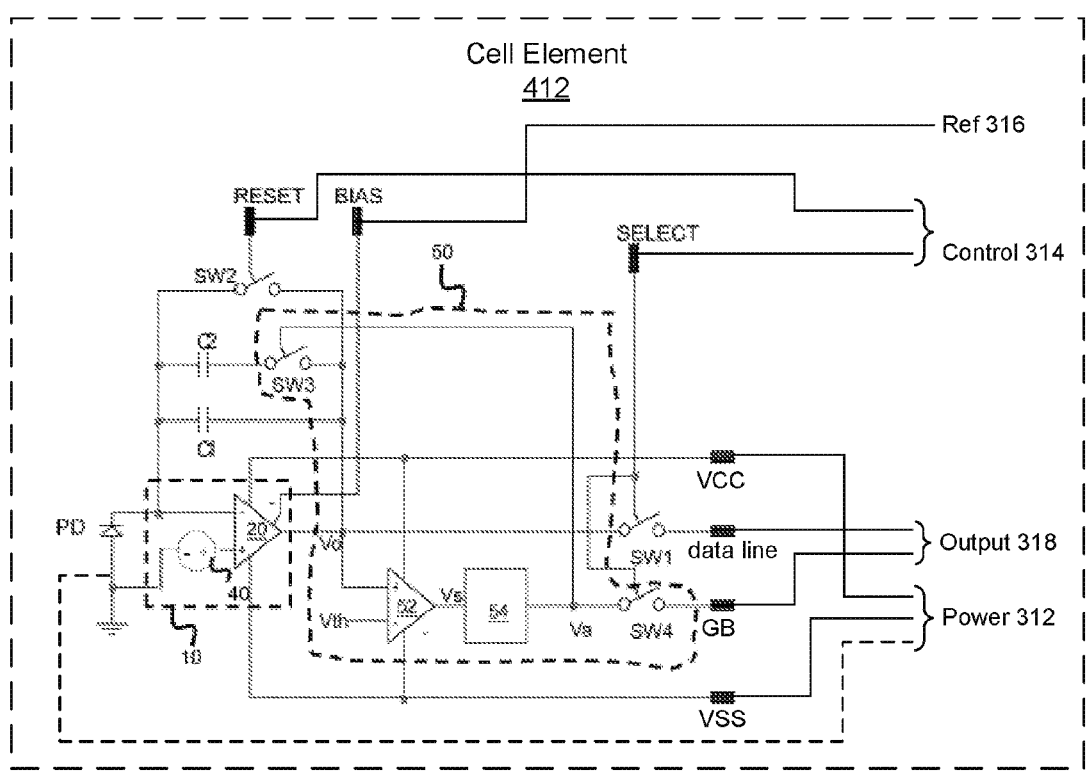
FIG. 12 illustrates a schematic diagram of another example imaging cell element for an array.

FIG. 12 illustrates another cell element 412 that includes a pixel circuit or detector element for an imaging array or matrix. Each of the pixel circuits 412 includes a photo diode PD, a biasing circuit 10, a gain-switching circuit 50, charge-to-voltage converters C1 and C2, and switches SW1 and SW2. The gain-switching circuit 50 includes a voltage comparator 52 (e.g., op amp) and a select circuit having a latch 54 and switches SW3 and SW4. The pixel circuit may be configured to operate based on control signals 314 RESET and SELECT and a reference signal 316 BIAS. VCC, VSS, and GND provide voltages or power 312 to the op amp 20, voltage comparator 52, latch 54, and other components of the pixel circuit. The data line and GB provide outputs 318.

Figure 13:
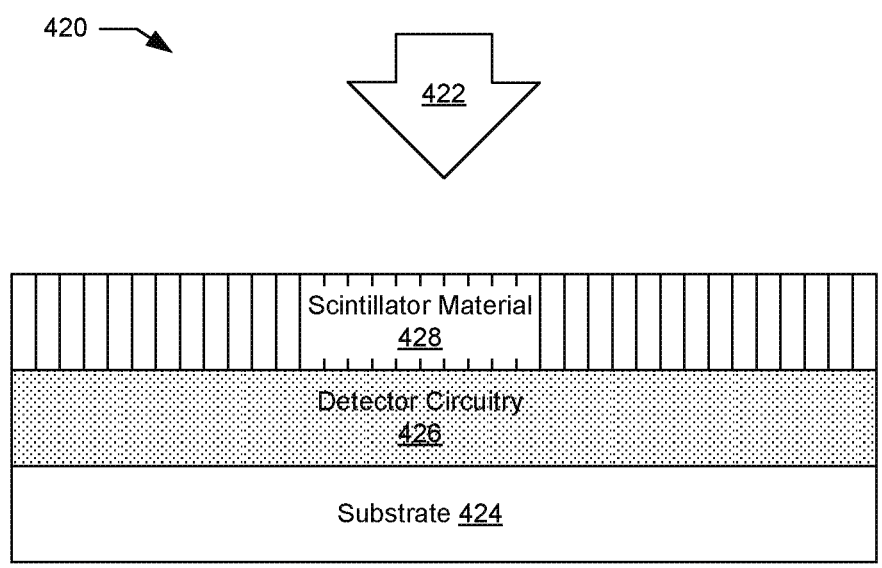
FIG. 13 illustrates a side view of layers in an example x-ray detector element in an x-ray detector array.

The pixel circuit or detector element may be used in an x-ray detector array or matrix (i.e., x-ray imager). An x-ray detector element (or detector element) refers to an element in a detector pixel that converts x-ray photons to electrical charges. A detector element may include a photoconductor material which can convert x-ray photons directly to electrical charges (electron-hole pairs) in a direct detection scheme. Suitable photoconductor material include and are not limited to mercuric iodide ($HgI_2$), lead iodide ($PbI_2$), bismuth iodide ($BiI_3$), cadmium zinc telluride (CdZnTe), or amorphous selenium (a-Se). In some embodiments, a detector element may comprise a scintillator material which converts x-ray photons to light and a photosensitive element coupled to the scintillator material to convert the light to electrical charges (i.e., indirect detection scheme), as illustrated in FIG. 13. FIG. 13 illustrates a radiation source 422 relative to the layers of an x-ray detector element 420 using the indirect detection scheme, which includes a substrate 424, photosensitive element and detector circuitry 426, and a layer of scintillator material 428. The x-ray detector element 420 may include other layers, sections shown may include multiple layers (e.g., detector circuitry 426 includes multiple processing layers), or the layers may be in a different order. Suitable scintillator materials include and are not limited to gadolinium oxisulfide ($Gd_2O_2S$:Tb), cadmium tungstate ($CdWO_4$), bismuth germanate ($Bi_4Ge_3O_{12}$ or BGO), cesium iodide (CsI), or cesium iodide thallium (CsI:Tl)). Suitable photosensitive element may include a photodiode, a photogate, or phototransistors.

Other circuitry for pixel circuits or detector elements representing cell elements may also be used. The cell elements may also represent a pixel display element (not shown) used in a display array to emit light (instead of detect light) from light emitting diodes (LEDs).

Figure 14:
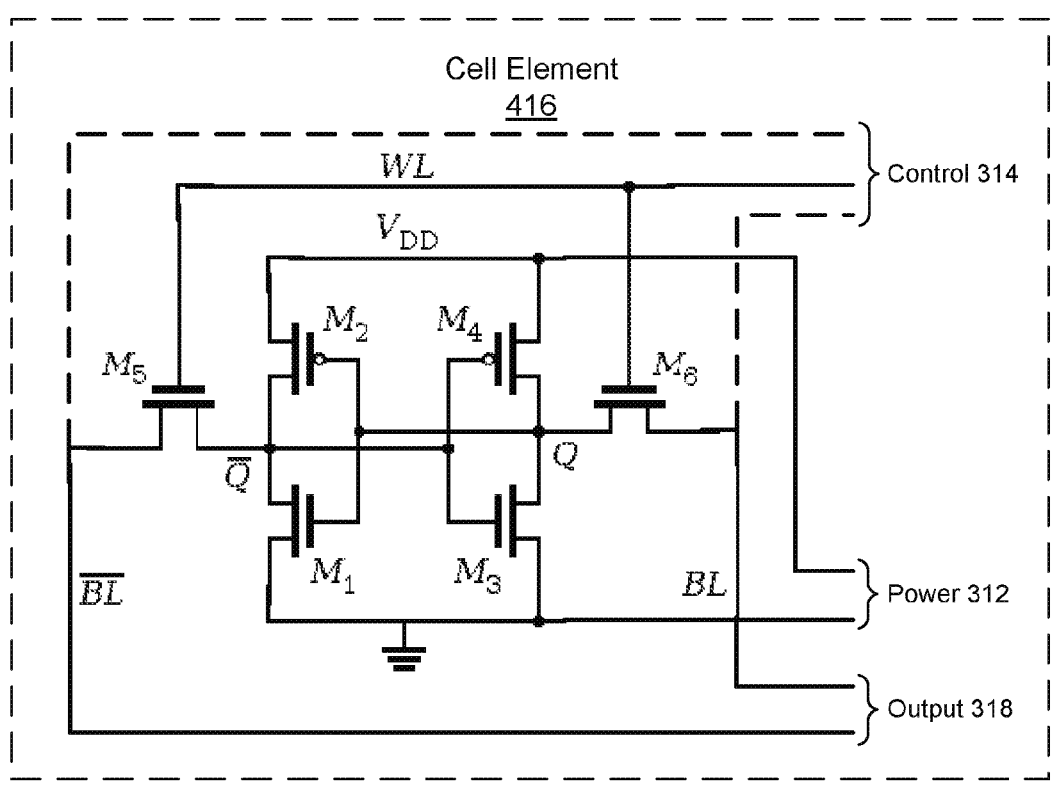
FIG. 14 illustrates a schematic diagram of an example six transistor static random-access memory (SRAM) cell element for an array.

FIG. 14 illustrates a cell element 416 that includes a memory element for a static random-access memory (SRAM) array or matrix. The memory element 416 includes six transistors (M1, M2, M3, M4, M5, and M6. Transistors M1, M2, M3, and M4 store the bit and transistors M5 and M6 couples the memory element to the bit line BL, which acts as an input for writes and an output for reads. VDD and GND provide voltages or power 312 to transistors M1, M2, M3, and M4. The memory element is configured to operate based on control signals 314 word line WL and bit line BL and inverse of bit line $\overline{BL}$ for writes and word line WL for reads. On reads, BL and $\overline{BL}$ provide outputs 318. Because BL and $\overline{BL}$ can provide both inputs and outputs, these lines or traces may be coupled to the isolator switches 240A-N (FIGS. 6-10) for the control signal traces 334A-N (FIGS. 6-10). The memory element 416 may not include a reference input. In some example, the cell element 310A-H and 310M-X (FIGS. 6-10) may not include both control signal input and a reference signal input.

FIGS. 11-12 and 14 provide different types of cell elements that may be used in matrix type ICs. The embodiments disclosed may also have application to other types of ICs with cell elements in a matrix or 2D array.

Figure 15:
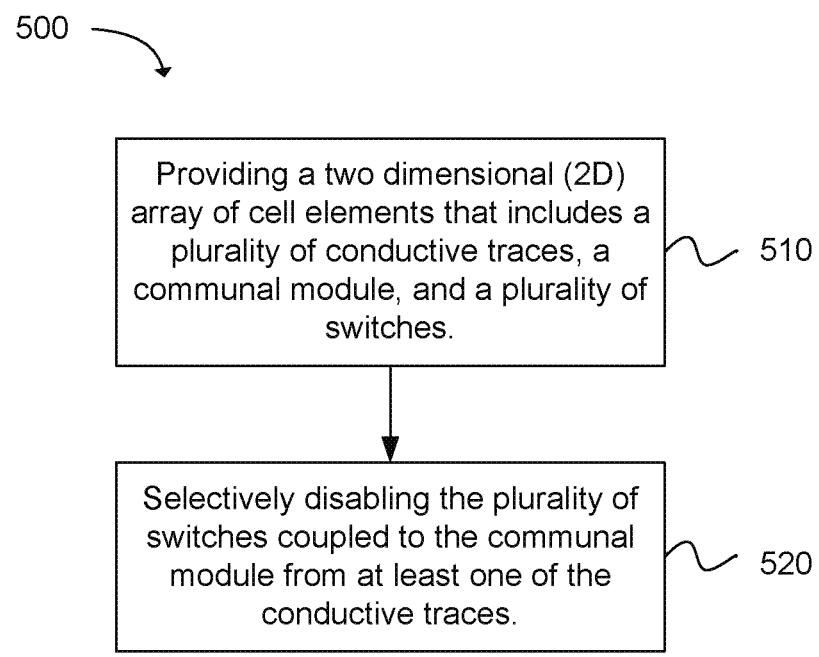
FIG. 15 is flowchart illustrating an example of a method of selectively disabling a plurality of switches coupled to a communal module for a matrix type integrated circuit.

The flowchart shown in FIG. 15 illustrates a method 500 of selectively disabling a plurality of switches coupled to a communal module for a matrix type integrated circuit. The method may be executed as instructions on a machine or computer circuitry, where the instructions are included on at least one computer readable medium or at least one non-transitory machine readable storage medium. The method includes the step of providing a 2D array of cell elements 310A-H and 310M-X that includes a plurality of conductive traces 332A-D, 334A-D, and 336A-D, a communal module 320, and a plurality of switches 342B, 344B, and 346B of the isolation circuitry 340A-N, as in step 510. The plurality of conductive traces 332A-D, 334A-D, and 336A-D is substantially parallel to a first axis (e.g., y-axis) of the 2D array. Each conductive trace is coupled to a conductive interconnect of cell elements adjacent to the conductive trace. Each cell element provides a similar function (e.g., pixel detector element, pixel display element, or memory element). The communal module 320 is configured to provide distribution of electrical signals to the cell elements in the 2D array via at least two conductive traces that are substantially parallel to the first axis. Each switch 342B, 344B, and 346B in the plurality of switches 340A-340N is configured to selectively disconnect the communal module from one of the conductive traces. The step of selectively disabling the plurality of switches coupled to the communal module from at least one of the conductive traces follows, as in step 520. In a configuration, the plurality of switches can be selectively disabled using the disable logic 360.

In another example, the method can further include detecting a fault condition on at least one of the conductive traces 332A-D, 334A-D, and 336A-D using a plurality of fault detectors 370A-N. Each fault detector is coupled to at least one of the plurality of conductive traces. The next operation of the method includes generating a fault status signal when the fault condition occurs. The method can further include, using a fault status module 380, registering a fault status bit for each fault detector generating the fault status signal. The fault condition can include an excessive supply current on at least one of the conductive traces or a short circuit between at least two of the conductive traces.

In another example, the method can further include automatically programming the switches 340A-340N coupled to the communal module 320 that are disabled from the conductive traces based on the fault status signals from the plurality of fault detectors. In a configuration, the automatic programming of the plurality of switches can be performed by the automatic fault isolator 390.

Circuitry can include hardware, firmware, program code, executable code, computer instructions, and/or software. A non-transitory computer readable storage medium can be a computer readable storage medium that does not include a signal.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, including but not limited to logic chips, transistors, or other components. A module may also be implemented in programmable hardware devices, including but not limited to field programmable gate arrays (FPGA), programmable array logic, programmable logic devices or similar devices.

Reference throughout this specification to an "example" or an "embodiment" means that a particular feature, structure, or characteristic described in connection with the example is included in at least one embodiment of the invention. Thus, appearances of the words an "example" or an "embodiment" in various places throughout this specification are not necessarily all referring to the same embodiment.

Furthermore, the described features, structures, or characteristics may be combined in a suitable manner in one or more embodiments. In the following description, numerous specific details are provided (e.g., examples of layouts and designs) to provide a thorough understanding of embodiments of the invention. One skilled in the relevant art will recognize, however, that the invention can be practiced without one or more of the specific details, or with other methods, components, layouts, etc. In other instances, well-known structures, components, or operations are not shown or described in detail to avoid obscuring aspects of the invention.

While the forgoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited. Various features and advantages of the invention are set forth in the following claims.

What is claimed is:

1. A matrix type integrated circuit, comprising:
    a two dimensional (2D) array of cell elements, wherein each cell element provides a similar function;
    a plurality of conductive traces substantially parallel to a first axis of the 2D array, wherein each conductive trace is coupled to a conductive interconnect of cell elements adjacent to the conductive trace;
    a communal module configured to provide distribution of at least one electrical signal to the cell elements in the 2D array via at least two conductive traces that are substantially parallel to the first axis; and
    a plurality of switches, wherein each switch is configured to selectively disconnect the communal module from one of the conductive traces.

2. The matrix type integrated circuit of claim 1, wherein the matrix integrated circuit is a complementary metal-oxide-semiconductor (CMOS) image sensor and each cell element includes a photodiode for a pixel.

3. The matrix type integrated circuit of claim 2, wherein the CMOS image sensor is an X-ray image sensor that includes a scintillator layer that coverts radiation into light photons for the photodiodes.

4. The matrix type integrated circuit of claim 1, wherein the switch is selected from a group consisting of tri-state logic and an enable buffer.

5. The matrix type integrated circuit of claim 1, wherein a length of each of the at least two of the plurality of conductive traces extends beyond a reticle boundary.

6. The matrix type integrated circuit of claim 1, wherein a length of each of the at least two of the plurality of conductive traces is greater than 50 millimeters (mm).

7. The matrix type integrated circuit of claim 1, wherein:
    the plurality of conductive traces include at least one power trace, at least one digital signal trace, and at least one analog signal trace coupled to each cell element;
    the communal module is configured to provide distribution of
        a power signal to the cell elements in the 2D array via the at least one power trace, and
        a control signal to the cell elements in the 2D array via the at least one digital signal trace, and
        a reference signal to the cell elements in the 2D array via the at least one analog signal trace; and
    the plurality of switches includes at least one power switch, at least one control switch, and at least one reference switch, and the plurality of switches are controlled by an enable signal, and the at least one power switch is coupled to the at least one power trace, the at least one control switch is coupled to the at least one digital signal trace, and the at least one reference switch is coupled to the at least one analog signal trace.

8. The matrix type integrated circuit of claim 1, further comprising:
    disable logic to selectively disable the plurality of switches, wherein the disable logic includes a programming port that allows external access to the matrix type integrated circuit for programming the disable logic.

9. The matrix type integrated circuit of claim 8, wherein the disable logic is selected from a group consisting of a serial control register, a shift register, an address register, a programmable read-only memory (PROM), a non-volatile random-access memory (NVRAM), and combinations thereof.

10. The matrix type integrated circuit of claim 1, further comprising:
a plurality of fault detectors, wherein each fault detector is coupled to at least one of the plurality of conductive traces and is configured to detect a fault condition on the coupled conductive traces and generate a fault status signal when the fault condition occurs.

11. The matrix type integrated circuit of claim 1, wherein each fault detector includes a current sense amplifier, and the fault condition is selected from a group consisting of an excessive supply current on at least one of the conductive traces, a short circuit between at least two of the conductive traces, and combinations thereof.

12. The matrix type integrated circuit of claim 1, further comprising:
a fault status module coupled to the plurality of the fault detectors, wherein the fault status module is configured to capture the fault status signal for each fault and the fault status module includes a status port that allows external access to the matrix type integrated circuit for reading the captured fault status signals from the plurality of fault detectors, and wherein the fault status module is selected from a group consisting of a serial register, a shift register, a multiplexer, a non-volatile random-access memory (NVRAM), and combinations thereof.

13. The matrix type integrated circuit of claim 12, wherein the fault status module includes a fault detector selector input to read the fault status signal of a specified fault detector from the status port.

14. The matrix type integrated circuit of claim 12, further comprising:
disable logic configured to selectively disable the plurality of switches, wherein the disable logic includes an internal programming input; and
an automatic fault isolator configured to program the disable logic via the internal programming input based on the fault status signal for each fault detector obtained by the fault status module.

15. The matrix type integrated circuit of claim 14, wherein the automatic fault isolator includes circuitry selected from a group consisting of a field-programmable gate array (FPGA), a state machine, a microprocessor, and combinations thereof.

16. The matrix type integrated circuit of claim 14, wherein the automatic fault isolator includes a fault detector selector output, a fault status input, and a disable logic program output, and
the fault detector selector output is coupled to a fault detector selector input of the fault status module that is configured for selecting a specified fault detector,
the fault status input is coupled to the status port of the fault status module that is configured for reading the fault status signal of the specified fault detector, and
the disable logic program output is coupled to the internal programming input of the disable logic to selectively disable the plurality of switches based on the fault conditions detected by the plurality of fault detectors.

17. The matrix type integrated circuit of claim 14, wherein the automatic fault isolator includes a programming port that allows external access to the matrix type integrated circuit for programming the automatic fault isolator.

18. A method of selectively disabling a plurality of switches coupled to a communal module for a matrix type integrated circuit, the method comprising:
providing a two dimensional (2D) array of cell elements that includes:
a plurality of conductive traces substantially parallel to a first axis of the 2D array, wherein each conductive trace is coupled to a conductive interconnect of cell elements adjacent to the conductive trace, and wherein each cell element provides a similar function,
a communal module configured to provide distribution of electrical signals to the cell elements in the 2D array via at least two conductive traces that are substantially parallel to the first axis, and
a plurality of switches, wherein each switch is configured to selectively disconnect the communal module from one of the conductive traces; and
selectively disabling at least one of the plurality of switches coupled to the communal module from at least one of the conductive traces.

19. The method of claim 18, further comprising:
detecting a fault condition on at least one of the conductive traces using a plurality of fault detectors, wherein each fault detector is coupled to at least one of the plurality of conductive traces, and the fault condition is selected from a group consisting of an excessive supply current on at least one of the conductive traces, a short circuit between at least two of the conductive traces, and combinations thereof; and
generating a fault status signal when the fault condition occurs.

20. The method of claim 19, further comprising:
registering, using a fault status module, a fault status bit for each fault detector generating the fault status signal.

21. The method of claim 19, further comprising:
based on the fault status signals from the plurality of fault detectors, automatically programming selected switches to disable the communal module from the conductive traces.

22. At least one non-transitory machine readable storage medium comprising a plurality of instructions adapted to be executed to implement the method of claim 19.

23. A matrix type integrated circuit, comprising:
a two dimensional (2D) array of cell elements arranged in vertical columns and horizontal rows, wherein each cell element provides a similar function;
a plurality of vertical traces arranged in each column of the 2D array, wherein each vertical trace is coupled to a conductive interconnect of cell elements within each column;
a communal module configured to provide distribution of electrical signals to the cell elements in the 2D array via at least two vertical traces for each column; and
a plurality of switches, wherein each switch is configured to selectively disconnect the communal module from one of the vertical traces.

24. The matrix type integrated circuit of claim 23, wherein the communal module includes a plurality of horizontal traces, wherein each switch is coupled to one of the plurality of horizontal traces.

25. The matrix type integrated circuit of claim 23, further comprising:
disable logic to selectively disable the plurality of switches, wherein the disable logic includes a programming port external to a package of the matrix type integrated circuit for programming the disable logic.

\* \* \* \* \*